(12) United States Patent
Nasuno et al.

(10) Patent No.: US 8,138,499 B2
(45) Date of Patent: Mar. 20, 2012

(54) STACKED PHOTOELECTRIC CONVERSION DEVICE

(75) Inventors: Yoshiyuki Nasuno, Osaka (JP); Yasuaki Ishikawa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 147 days.

(21) Appl. No.: 12/666,753

(22) PCT Filed: May 29, 2008

(86) PCT No.: PCT/JP2008/059935
§ 371 (c)(1),
(2), (4) Date: Dec. 24, 2009

(87) PCT Pub. No.: WO2009/001646
PCT Pub. Date: Dec. 31, 2008

(65) Prior Publication Data
US 2010/0171119 A1    Jul. 8, 2010

(30) Foreign Application Priority Data
Jun. 25, 2007  (JP) .................... 2007-166600

(51) Int. Cl.
*H01L 31/04* (2006.01)
*H01L 31/105* (2006.01)

(52) U.S. Cl. .................. 257/53; 257/458; 257/E31.047; 257/E31.062; 136/243; 136/256

(58) Field of Classification Search .................... 257/53, 257/458, E31.047, E31.062; 136/243–265
See application file for complete search history.

(56) References Cited

U.S. PATENT DOCUMENTS

| 2002/0011264 A1* | 1/2002 | Saito ............................ 136/258 |
| 2004/0149330 A1 | 8/2004 | Sugiyama et al. |
| 2005/0000563 A1 | 1/2005 | Nakayama et al. |
| 2006/0043517 A1* | 3/2006 | Sasaki et al. .................. 257/458 |
| 2006/0097259 A1* | 5/2006 | Suezaki et al. .................. 257/66 |

FOREIGN PATENT DOCUMENTS

| JP | 11-243218 | 9/1999 |
| JP | 2003-142709 | 5/2003 |
| JP | 2004-165394 | 6/2004 |
| JP | 2004-356623 | 12/2004 |

OTHER PUBLICATIONS

International Search Report for PCT/JP2008/059935, mailed Sep. 16, 2008.

* cited by examiner

*Primary Examiner* — Nathan W. Ha
*Assistant Examiner* — Mamadou Diallo
(74) *Attorney, Agent, or Firm* — Nixon & Vanderhye P.C.

(57) ABSTRACT

To provide a stacked photoelectric conversion device capable of inhibiting extreme decrease of the output in the morning and evening.

A stacked photoelectric conversion device of the present invention comprises a first photoelectric conversion layer, a second photoelectric conversion layer and a third photoelectric conversion layer stacked in this order from a light entrance side, each photoelectric conversion layer having a p-i-n junction and formed of a silicon based semiconductor, wherein a short-circuit photocurrent of the first photoelectric conversion layer is larger than a short-circuit photocurrent of the second photoelectric conversion layer or a short-circuit photocurrent of the third photoelectric conversion layer under a condition of light source: xenon lamp, irradiance: 100 mW/cm$^2$, AM: 1.5, and temperature: 25° C.

2 Claims, 3 Drawing Sheets

STACKED PHOTOELECTRIC CONVERSION DEVICE

This application is the U.S. national phase of International Application No. PCT/JP2008/059935 filed 29 May 2008, which designated the U.S. and claims priority to Japan Application No. 2007-166600 filed 25 Jun. 2007, the entire contents of each of which are hereby incorporated by reference.

TECHNICAL FIELD

The technology presented herein relates to a stacked photoelectric conversion device.

BACKGROUND ART AND SUMMARY

In recent years, thin-film photoelectric conversion devices which are formed from gaseous materials by a plasma CVD method have received attention. Examples of such thin-film photoelectric conversion devices include silicon base thin-film photoelectric conversion devices including a silicon base thin-film, thin-film photoelectric conversion devices including CIS ($CuInSe_2$) compounds or CIGS (Cu (In, Ga) $Se_2$) compounds, and the like, and development of these devices are accelerated and their quantity of production is increasingly enlarged. A major feature of these photoelectric conversion devices lies in a fact that these devices have potential that cost reduction and higher performance of the photoelectric conversion device can be simultaneously achieved by layering a semiconductor layer or a metal electrode film on a low-cost substrate having a large area with a formation apparatus such as a plasma CVD apparatus or a sputtering apparatus, and then separating and connecting photoelectric conversion devices prepared on the same substrate by laser patterning or the like.

One structure of such a thin film photoelectric conversion device is a structure of a stacked photoelectric conversion device making effective use of incident light. The structure of the stacked photoelectric conversion device is a structure for splitting an incident light spectrum and receiving the split light spectrum in a plurality of photoelectric conversion layers, and by stacking a plurality of photoelectric conversion layers which use a semiconductor material having a bandgap suitable for absorbing the respective wavelength bands in decreasing order of bandgap from a light entrance side, it is possible to absorb short wavelength light in the photoelectric conversion layer having a large bandgap and long-wavelength light in the photoelectric conversion layer having a small bandgap, respectively. Therefore, sunlight having a wider wavelength band can contribute to the photoelectric conversion compared with a device provided with one photoelectric conversion layer, and therefore it becomes possible to enhance the photoelectric conversion efficiency.

Patent Document 1 discloses a stacked photoelectric conversion device having a first p-i-n junction, a second p-i-n junction, and a third p-i-n junction in this order from the light entrance side, wherein the first p-i-n junction has an i-type layer of amorphous silicon, the second p-i-n junction has an i-type layer of microcrystalline silicon, the third p-i-n junction has an i-type layer of microcrystalline silicon. It is described that by employing such a constitution, it is possible to realize high photoelectric conversion efficiency by effective use of light and reduce impact caused by light degradation of the i-type amorphous silicon, and thus to improve the photoelectric conversion efficiency after light degradation.

As another stacked photoelectric conversion device of a three junction type, a stacked photoelectric conversion device (a-SiC/a-SiGe/a-SiGe), in which amorphous silicon-carbon is used as an i-type layer of first p-i-n junction at the light entrance side, amorphous silicon-germanium is used as an i-type layer of a second p-i-n junction at the light entrance side and amorphous silicon-germanium having a smaller bandgap than that of the i-type layer of the second p-i-n junction is used as an i-type layer of a third p-i-n junction at the light entrance side, is known.

Patent Document 1: Japanese Unexamined Patent Publication No. HEI 11 (1999)243218

In the meantime, in a stacked photoelectric conversion device including a first photoelectric conversion layer, a second photoelectric conversion layer and a third photoelectric conversion layer, stacked in this order from a light entrance side, the lowest photocurrent of the photocurrents generated in the respective photoelectric conversion layers is the output current from the photoelectric conversion device. In order to take out the output current efficiently, it is general to make even the photocurrents of the first photoelectric conversion layer, the second photoelectric conversion layer, and the third photoelectric conversion layer under a condition of light source: xenon lamp, irradiance: 100 $mW/cm^2$, AM: 1.5, and temperature: 25° C. Thereby, irradiation light is used effectively, and a high output is obtained.

However, in the stacked photoelectric conversion device in which the short-circuit photocurrents are made even as described above, a higher output can be obtained during daytime hours, but the output extremely decreases in the morning and evening.

In view of such circumstances, the example embodiment presented herein has been achieved to provide a stacked photoelectric conversion device capable of preventing extreme decrease of the output in the morning and evening.

A stacked photoelectric conversion device of the present embodiment comprises a first photoelectric conversion layer, a second photoelectric conversion layer and a third photoelectric conversion layer stacked in this order from a light entrance side, each photoelectric conversion layer having a p-i-n junction and formed of a silicon based semiconductor, wherein a short-circuit photocurrent of the first photoelectric conversion layer is larger than a short-circuit photocurrent of the second photoelectric conversion layer or a short-circuit photocurrent of the third photoelectric conversion layer under a condition of light source: xenon lamp, irradiance: 100 $mW/cm^2$, AM: 1.5, and temperature: 25° C. (hereinafter, referred to as "standard condition").

In the following description, the short-circuit photocurrent of the first photoelectric conversion layer, the short-circuit photocurrent of the second photoelectric conversion layer, and the short-circuit photocurrent of the third photoelectric conversion layer will be also referred to as a first short-circuit photocurrent, a second short-circuit photocurrent, and a third short-circuit photocurrent, respectively.

A study was carried out on the cause of the extreme decrease of the output in the morning and evening to find out that the proportion of a short wavelength component in a sunlight spectrum decreases in the morning and evening and therefore the first short-circuit photocurrent gets extremely smaller than the second short-circuit photocurrent and the third short-circuit photocurrent, and the extreme decrease of the output in the morning and evening is attributed to the fact that such smallness of the first short-circuit photocurrent limits the output current from the photoelectric conversion device. On the basis of this finding, it was found that the output current from the photoelectric conversion device is inhibited from being limited by such smallness of the first short-circuit photocurrent by adjusting a thickness or the like of each photoelectric conversion layer so that the first short-circuit photocurrent will be larger than the second short-circuit photocurrent or the third short-circuit photocurrent under the standard condition, and extreme decrease of the output in the morning and evening can be thereby prevented.

Hereinafter, various embodiments will be exemplified.

The i-type semiconductor layers of the first and second photoelectric conversion layers may be amorphous layers, respectively, and the i-type semiconductor layer of the third photoelectric conversion layer may be a microcrystalline layer.

The ratio of the first short-circuit photocurrent to the smaller one of the second short-circuit photocurrent and the third short-circuit photocurrent may be 1.01 to 1.30 times.

The second short-circuit photocurrent may be larger than the third short-circuit photocurrent under the standard condition.

The ratio of the second short-circuit photocurrent to the third short-circuit photocurrent may be 1.01 to 1.30 times.

The thickness of the first photoelectric conversion layer may be 50 nm to 300 nm.

The thickness of the second photoelectric conversion layer may be 100 nm to 1000 nm.

The thickness of the third photoelectric conversion layer may be 500 nm to 20 μm.

The various embodiments shown herein may be appropriately combined with one another.

DESCRIPTION OF THE REFERENCE NUMERALS

Figure 1:
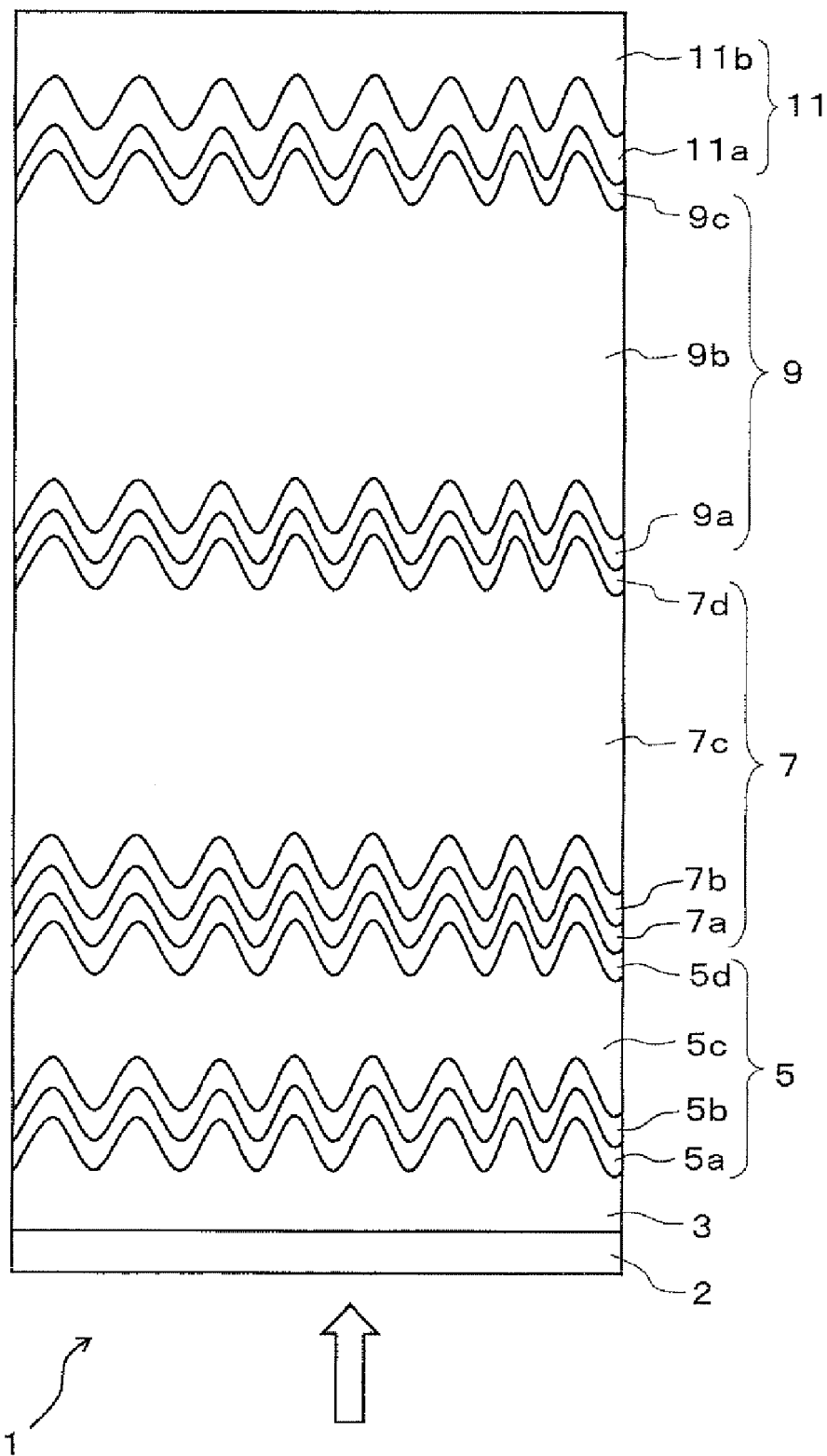
FIG. 1 is a cross sectional view illustrating a configuration of a stacked photoelectric conversion device of an embodiment.

1 Stacked photoelectric conversion device
2 Substrate
3 First electrode
5 First photoelectric conversion layer
7 Second photoelectric conversion layer
9 Third photoelectric conversion layer
11 Second electrode
5a P-type semiconductor layer
5b Buffer layer
5c I-type amorphous layer
5d N-type semiconductor layer
7a P-type semiconductor layer
7b Buffer layer
7c I-type amorphous layer
7d N-type semiconductor layer
9a P-type semiconductor layer
9b I-type microcrystalline layer
9c N-type semiconductor layer
11a Transparent conductive film
11b Metal film
101 Film forming chamber
102 Cathode electrode
103 Anode electrode
105 Impedance matching circuit
106a Power introducing line
106b Power introducing line
107 Substrate
108 Power supply section
110 Gas intake section
116 Gas exhaust section
117 Pressure control valve
118 Gas
119 Gas exhaust outlet

DETAILED DESCRIPTION

A stacked photoelectric conversion device (hereinafter, may be referred to as "photoelectric conversion device") of the present embodiment comprises a first photoelectric conversion layer, a second photoelectric conversion layer and a third photoelectric conversion layer stacked in this order from a light entrance side, each photoelectric conversion layer having a p-i-n junction and formed of a silicon based semiconductor, wherein the first short-circuit photocurrent is larger than the second short-circuit photocurrent or the third short-circuit photocurrent under the standard condition.

The term "silicon based semiconductor" means amorphous or microcrystalline silicon, or semiconductors (silicon carbide, silicon-germanium, etc.) formed by doping amorphous or microcrystalline silicon with carbon, germanium, or other impurities. The term "microcrystalline silicon" means silicon in a state of a mixed phase of crystalline silicon having a small grain size (from several tens to 1000 Å) and amorphous silicon. Such microcrystalline silicon is formed, for example, when a crystal silicon thin film is prepared at low temperature by using a non-equilibrium method such as a plasma CVD method.

The first photoelectric conversion layer, the second photoelectric conversion layer, and the third photoelectric conversion layer may be all made of a silicon based semiconductor of the same kind, or may be made of silicon based semiconductors of different kinds.

Each of the first photoelectric conversion layer, the second photoelectric conversion layer, and the third photoelectric conversion layer includes a p-type semiconductor layer, an i-type semiconductor layer, and an n-type semiconductor layer, and each semiconductor layer is made of a silicon based semiconductor. The respective semiconductor layers included in the photoelectric conversion layers may be all made of a silicon based semiconductor of the same kind, or may be made of silicon based semiconductors of different kinds. For example, the p-type semiconductor layer and the i-type semiconductor layer may be formed of amorphous silicon, and the n-type semiconductor layer may be formed of microcrystalline silicon. Further, for example, the p-type semiconductor layer and the n-type semiconductor layer may be formed of silicon carbide or silicon-germanium, and the i-type semiconductor layer may be formed of silicon.

Further, the p-type semiconductor layer, the i-type semiconductor layer, and the n-type semiconductor layer may have a monolayer structure or a multilayer structure. When the semiconductor layers have a multilayer structure, the respective layers may be made of silicon based semiconductors of different kinds.

Preferably, the bandgap of the i-type semiconductor layer in the first photoelectric conversion layer is wider than either the bandgap of the i-type semiconductor layer in the second photoelectric conversion layer or the bandgap of the i-type semiconductor layer in the third photoelectric conversion layer. This is because, by forming such a bandgap, light of wavelength band that the first photoelectric conversion layer cannot be absorbed in the second photoelectric conversion layer and the third photoelectric conversion layer, and incident light can be utilized effectively. However, a problem will be likely that the first short-circuit photocurrent is easy to decrease more significantly than the second short-circuit photocurrent and the third short-circuit photocurrent when the proportion of a short wavelength component in the sunlight spectrum is smaller. Preferably, in addition, the bandgap of the i-type semiconductor layer in the second photoelectric conversion layer is wider than the bandgap of the i-type semiconductor layer in the third photoelectric conversion layer. This is because, by forming such a bandgap, light of wavelength band that the first photoelectric conversion layer and the second photoelectric conversion layer cannot absorb can be absorbed in the third photoelectric conversion layer, and incident light can be utilized effectively.

In the following description, a semiconductor layer made of an amorphous silicon based semiconductor will be referred to as "amorphous layer", a semiconductor layer made of a microcrystalline silicon based semiconductor will be referred to as "microcrystalline layer", and a layer made of an amorphous or microcrystalline silicon based semiconductor will be referred to as "semiconductor layer".

Hereinafter, an embodiment will be described by use of the drawings. The contents shown in the drawings and the following description are exemplification, and the scope of the present embodiment is not limited to the contents shown in the drawings and the following description. Hereinafter, the present embodiment will be described taking a photoelectric conversion device of a superstrate structure as an example, but the following description is basically also true for a photoelectric conversion device of a substrate structure. In addition, the present embodiment will be described taking, as an example, the case where i-type semiconductor layers of a first photoelectric conversion layer and a second photoelectric conversion layer are both amorphous layers, and an i-type semiconductor layer of a third photoelectric conversion layer is a microcrystalline layer, but the following description is basically also true for photoelectric conversion devices of other configurations, for example: a photoelectric conversion device of a configuration in which all the i-type semiconductor layers of the first, second, and third photoelectric conversion layers are amorphous layers or microcrystalline layers; a photoelectric conversion device of a configuration in which the i-type semiconductor layer of the first photoelectric conversion layer is an amorphous layer and the i-type semiconductor layers of the second and third photoelectric conversion layers are both microcrystalline layers; and a photoelectric conversion device of a configuration in which another photoelectric conversion layer is further provided at a downstream side with respect to the third photoelectric conversion layer. Furthermore, the present embodiment will be described taking, as an example, the case where the p-i-n junction of each photoelectric conversion layer has a p-type semiconductor layer, an i-type semiconductor layer, and an n-type semiconductor layer arranged in this order, but the following description is basically also true for the case where the p-i-n junction of each photoelectric conversion layer has an n-type semiconductor layer, an i-type semiconductor layer, and a p-type semiconductor layer arranged in this order.

1. Configuration of Photoelectric Conversion Device

First, a configuration of a photoelectric conversion device of this embodiment will be described by use of FIG. 1. FIG. 1 is a sectional view illustrating the configuration of the photoelectric conversion device of this embodiment.

As illustrated in FIG. 1, a photoelectric conversion device 1 of the present embodiment includes a first electrode 3, a first photoelectric conversion layer 5, a second photoelectric conversion layer 7, a third photoelectric conversion layer 9, and a second electrode 11, stacked on a substrate 2. The substrate 2 and the first electrode 3 have a light-transmitting property, and light enters from a side of the substrate 2.

The first photoelectric conversion layer 5 includes a p-type semiconductor layer 5a, a buffer layer 5b formed of an i-type amorphous layer, an i-type amorphous layer 5c, and an n-type semiconductor layer 5d, stacked in this order. The second photoelectric conversion layer 7 includes a p-type semiconductor layer 7a, a buffer layer 7b formed of an i-type amorphous layer, an i-type amorphous layer 7c, and an n-type semiconductor layer 7d, stacked in this order. The third photoelectric conversion layer 9 includes a p-type semiconductor layer 9a, an i-type microcrystalline layer 9b, and an n-type semiconductor layer 9c, stacked in this order. The buffer layers 5b and 7b may be omitted. The second electrode 11 includes a transparent conductive film 11a and a metal film 11b, stacked in this order. The p-type semiconductor layer is doped with p-type impurity atoms such as boron and aluminum, and the n-type semiconductor layer is doped with n-type impurity atoms such as phosphorus. The i-type semiconductor layer may be a semiconductor layer which is entirely undoped, or may be a weak p-type or a weak n-type semiconductor layer including a trace of impurities and having an adequate photoelectric conversion function.

The first short-circuit photocurrent is larger than the second short-circuit photocurrent or the third short-circuit photocurrent under the standard condition. When the magnitudes of the first, second, and third short-circuit photocurrents are made even under the standard condition following the convention, and when the proportion of a short wavelength component in the sunlight spectrum is decreased than that under the standard condition and decrease of the first short-circuit photocurrent is larger than decrease of the second short-circuit photocurrent and decrease of the third short-circuit photocurrent, the first short-circuit photocurrent will be extremely smaller than the second short-circuit photocurrent and the third short-circuit photocurrent, and such smallness of the first short-circuit photocurrent limits the output current from the photoelectric conversion device. As a result, the output of the photoelectric conversion device will be significantly reduced. In this embodiment, the first short-circuit photocurrent is set to be larger than the second short-circuit photocurrent or the third short-circuit photocurrent under the standard condition, and therefore limitation of the output current from the photoelectric conversion device by smallness of the first short-circuit photocurrent is prevented, thereby allowing prevention of extreme reduction of the output of the photoelectric conversion device. Preferably, the first short-circuit photocurrent is larger than both of the second short-circuit photocurrent and the third short-circuit photocurrent under the standard condition.

The first to third short-circuit photocurrents under the standard condition can be measured by the following method.
(1) Each of the first, second, and third photoelectric conversion layers 5, 7, 9 is measured for the spectral sensitivity in a wavelength range of 300 nm to 1100 nm at a temperature of 25° C.

When the first photoelectric conversion layer 5 is measured for the spectral sensitivity, the photoelectric conversion device 1 is irradiated with such color bias light that is absorbed mainly in the second photoelectric conversion layer 7 and the third photoelectric conversion layer 9, and that allows the first short-circuit photocurrent to be smaller than the second short-circuit photocurrent and the third short-circuit photocurrent. At this time, such a voltage that allows the voltage across the first photoelectric conversion layer 5 to be 0 V may be applied to the photoelectric conversion device 1 in a forward direction of the diode. Probe light of a single-wavelength having a certain power (approximately several tens µW/cm$^2$) is applied to the photoelectric conversion device 1 under this condition, and the output current from the photoelectric conversion device 1 at that time is measured. Thereby, the spectral sensitivity with respect to the probe light of the wavelength applied can be determined. In addition, the spectral sensitivity in a wavelength range of 300 nm to 1100 nm can be measured by scanning the wavelength of the probe light in a range of 300 nm to 1100 nm.

When the second photoelectric conversion layer 7 is measured for the spectral sensitivity, the photoelectric conversion device 1 is irradiated with such color bias light that is absorbed mainly in the first photoelectric conversion layer 5 and the third photoelectric conversion layer 9, and that allows the second short-circuit photocurrent to be smaller than the first short-circuit photocurrent and the third short-circuit photocurrent. This color bias light includes a short wavelength component that is absorbed mainly in the first photoelectric conversion layer 5 and a long wavelength component that is absorbed mainly in the third photoelectric conversion layer 9. At this time, such a voltage that allows the voltage across the second photoelectric conversion layer 7 to be 0 V may be applied to the photoelectric conversion device 1 in a forward direction of the diode. Under this condition, probe light is applied in the same manner as described above, and thereby the second photoelectric conversion layer 7 can be measured for the spectral sensitivity.

When the third photoelectric conversion layer 9 is measured for the spectral sensitivity, the photoelectric conversion device 1 is irradiated with such color bias light that is absorbed mainly in the first photoelectric conversion layer 5 and the second photoelectric conversion layer 7, and that allows the third short-circuit photocurrent to be smaller than the first short-circuit photocurrent and the second short-circuit photocurrent. At this time, such a voltage that allows the voltage across the third photoelectric conversion layer 9 to be 0 V may be applied to the photoelectric conversion device 1 in a forward direction of the diode. Under this condition, probe light is applied in the same manner as described above, and thereby the third photoelectric conversion layer 9 can be measured for the spectral sensitivity.

(2) Next, data of the spectral sensitivity of each photoelectric conversion layer is multiplied by a standard spectrum (spectrum under a condition of light source: xenon lamp, irradiance: 100 mW/cm$^2$, and AM: 1.5) to obtain a graph showing the relationship between the wavelength and the short-circuit photocurrent for each of the first, second, and third photoelectric conversion layers 5, 7, 9. Then, the short-circuit photocurrents of each of the first, second, and third photoelectric conversion layers 5, 7, 9, that is, the first, second, and third short-circuit photocurrents can be obtained by integrating short-circuit photocurrents at each wavelength in a wavelength range of 300 nm to 1100 nm in this graph.

The ratio of the first short-circuit photocurrent to the smaller one of the second short-circuit photocurrent and the third short-circuit photocurrent is not particularly limited, and it is, for example, 1.01 to 1.30 times, preferably 1.05 to 1.10 times, and specifically 1.01, 1.02, 1.03, 1.04, 1.05, 1.06, 1.07, 1.08, 1.09, 1.10, 1.11, 1.12, 1.13, 1.14, 1.15, 1.16, 1.17, 1.18, 1.19, 1.20, 1.21, 1.22, 1.23, 1.24, 1.25, 1.26, 1.27, 1.28, 1.29, and 1.30 times, for example. This ratio may be in a range between any two of the numeral values exemplified here.

When this ratio is larger, the impact of the spectral change is lessened. However, if the thickness of, for example, the first photoelectric conversion layer 5 is increased to increase this ratio, the output (conversion efficiency) at the maximum illuminance is decreased. Therefore, the ratio is preferably approximately 1.30 or less. The magnitude of the second short-circuit photocurrent and the magnitude of the third short-circuit photocurrent may be the same or different.

The second short-circuit photocurrent is preferably larger than the third short-circuit photocurrent under the standard condition. When the proportion of the short wavelength component in the sunlight spectrum decreases, decrease of the second short-circuit photocurrent can be larger than decrease of the third short-circuit photocurrent. Even in this case, however, extreme decrease of the second short-circuit photocurrent compared to the third short-circuit photocurrent can be prevented, that is, extreme decrease of the output can be prevented by previously setting the second short-circuit photocurrent to a value larger than the short-circuit photocurrent.

The ratio of the second short-circuit photocurrent to the third short-circuit photocurrent is not particularly limited, and it is, for example, 1.01 to 1.30 times, preferably 1.05 to 1.10 times, and specifically 1.01, 1.02, 1.03, 1.04, 1.05, 1.06, 1.07, 1.08, 1.09, 1.10, 1.11, 1.12, 1.13, 1.14, 1.15, 1.16, 1.17, 1.18, 1.19, 1.20, 1.21, 1.22, 1.23, 1.24, 1.25, 1.26, 1.27, 1.28, 1.29, and 1.30 times, for example. This ratio may be in a range between any two of the numeral values exemplified here.

The thickness of the first photoelectric conversion layer 5 may be approximately 50 nm to 300 nm, for example. When the thickness of the first photoelectric conversion layer 5 is insufficient, and the first photoelectric conversion layer 5 fails to absorb all light in a wavelength that the first photoelectric conversion layer 5 is supposed to be able to absorb, the amount of light absorption in the first photoelectric conversion layer 5 is increased by increasing the thickness of the first photoelectric conversion layer 5, and thereby the first short-circuit photocurrent can be increased. Specifically, the thickness of the first photoelectric conversion layer 5 is, for example, 50, 60, 70, 80, 90, 100, 110, 120, 130, 140, 150, 160, 170, 180, 190, 200, 210, 220, 230, 240, 250, 260, 270, 280, 290, or 300 nm. This thickness may be in a range between any two of the numeral values exemplified here. In addition, the amount of light absorption in the first photoelectric conversion layer 5 may be increased to increase the first short-circuit photocurrent by, for example, providing an interlayer between the first photoelectric conversion layer 5 and the second photoelectric conversion layer 7, and reflecting a part of light that has reached the interlayer on the first photoelectric conversion layer 5.

The thickness of the second photoelectric conversion layer 7 may be approximately 100 nm to 1000 nm, for example. When the thickness of the second photoelectric conversion layer 7 is insufficient, and the second photoelectric conversion layer 7 fails to absorb all light in a wavelength that the second photoelectric conversion layer 7 is supposed to be able to absorb, the amount of light absorption in the second photoelectric conversion layer 7 is increased by increasing the thickness of the second photoelectric conversion layer 7, and thereby the second short-circuit photocurrent can be increased. Specifically, the thickness of the second photoelectric conversion layer 7 is, for example, 100, 150, 200, 250, 300, 350, 400, 450, 500, 550, 600, 650, 700, 750, 800, 850, 900, 950, or 1000 nm. The thickness of the second photoelectric conversion layer 7 may be in a range between any two of the numeral values exemplified here. In addition, the amount of light absorption in the second photoelectric conversion layer 7 may be increased to increase the second short-circuit photocurrent by, for example, providing an interlayer between the second photoelectric conversion layer 7 and the third photoelectric conversion layer 9, and reflecting a part of light that has reached the interlayer on the second photoelectric conversion layer 7.

The thickness of the third photoelectric conversion layer 9 is, for example, approximately 500 nm to 20 µm, and specifically 500, 600, 700, 800, or 900 nm, or 1, 2, 3, 4, 5, 6, 7, 8, 9, 10, 11, 12, 13, 14, 15, 16, 17, 18, 19, or 20 µm, for example. The thickness of the third photoelectric conversion layer 9 may be in a range between any two of the numeral values exemplified here.

2. Plasma CVD Apparatus

Figure 2:
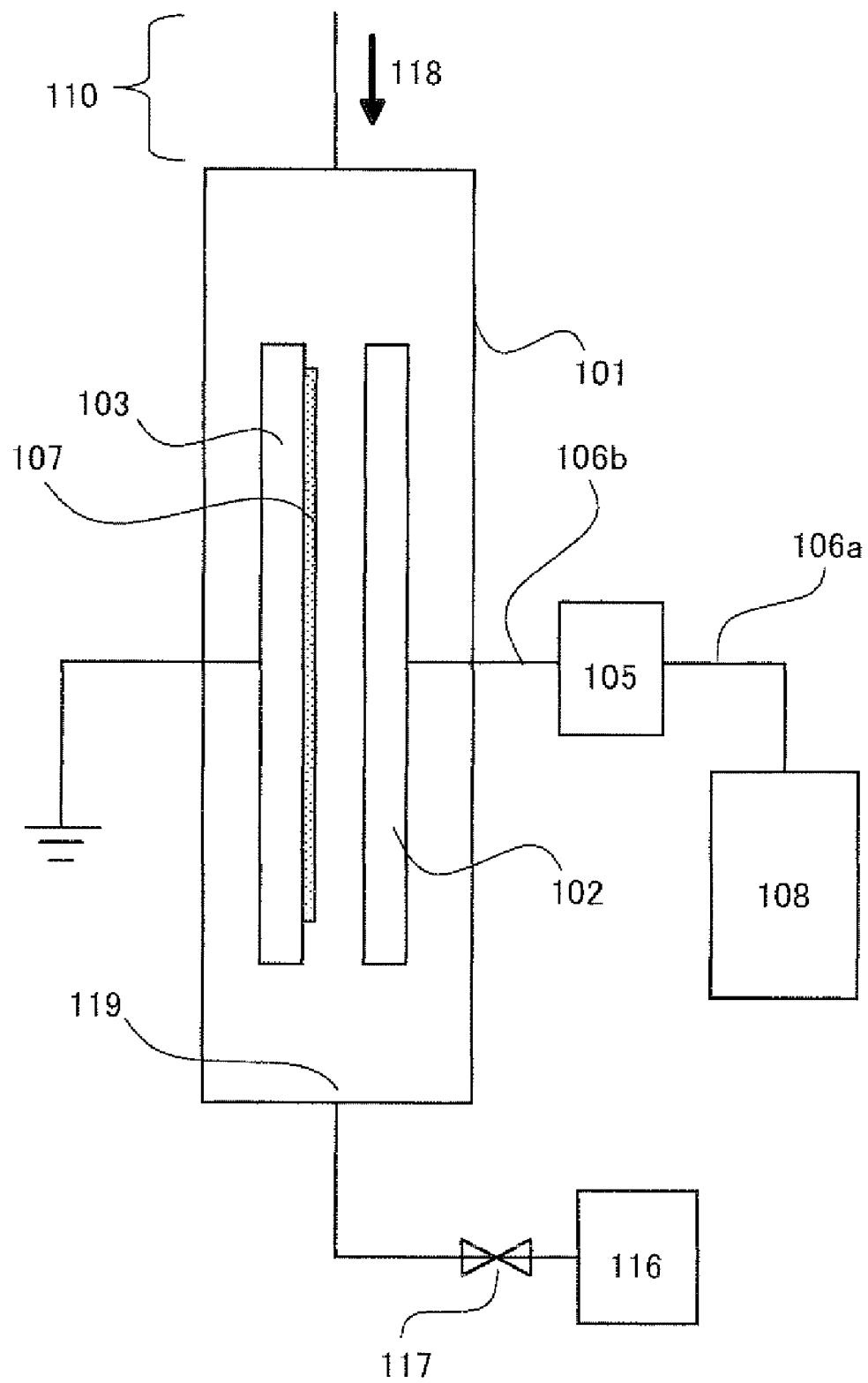
FIG. 2 is a cross sectional view illustrating a configuration of a plasma CVD apparatus used for producing a stacked photoelectric conversion device of an embodiment.

Next, a plasma CVD apparatus for forming a semiconductor layer included in the above photoelectric conversion device will be described by use of FIG. 2. FIG. 2 is a cross sectional view illustrating a configuration of a plasma CVD apparatus used for producing the photoelectric conversion device of this embodiment.

The configuration illustrated in FIG. 2 is an exemplification, and the semiconductor layer may be formed by use of an apparatus of another configuration. In addition, the semiconductor layer may be formed by a method other than plasma CVD. Here, a plasma CVD apparatus of a single chamber type having one film forming chamber will be described as an example, but the description is also true for a plasma CVD apparatus of a multi-chamber type having a plurality of film forming chambers.

As illustrated in FIG. 2, the plasma CVD apparatus used in this embodiment includes a film forming chamber 101 for forming a semiconductor layer therein, which can be hermetically sealed, a gas intake section 110 for introducing a replacement gas into the film forming chamber 101, and a gas exhaust section 116 for evacuating the replacement gas from the film forming chamber 101.

More specifically, the plasma CVD apparatus illustrated in FIG. 2 has a parallel plate-type electrode structure in which a cathode electrode 102 and an anode electrode 103 are installed in the film forming chamber 101 that can be hermetically sealed. The distance between the cathode electrode 102 and the anode electrode 103 is determined depending on desired treatment conditions, and it is generally several millimeters to several tens of millimeters. A power supply section 108 for supplying electric power to the cathode electrode 102 and an impedance matching circuit 105 for matching impedances among the power supply section 108, the cathode electrode 102, and the anode electrode 103 are installed outside the film forming chamber 101.

The power supply section 108 is connected to one end of a power introducing line 106a. The other end of the power introducing line 106a is connected to the impedance matching circuit 105. One end of a power introducing line 106b is connected to the impedance matching circuit 105, and the other end of the power introducing line 106b is connected to the cathode electrode 102. The power supply section 108 may output either of a CW (continuous waveform) alternating current output or a pulse-modulated (on/off control) alternating current output, or may be one capable of switching these outputs to output.

The frequency of the alternating electric power outputted from the power supply section 108 is generally 13.56 MHz, but it is not limited thereto, and frequencies of several kHz to VHF band and a microwave band may be used.

On the other hand, the anode electrode 103 is electrically grounded, and a substrate 107 is located on the anode electrode 103. The substrate 107 is, for example, the substrate 2 on which the first electrode 3 is formed. The substrate 107 may be placed on the cathode electrode 102, but it is generally placed on the anode electrode 103 in order to reduce degradation of film quality due to ion damage in plasma.

The gas intake section 110 is provided in the film forming chamber 101. A gas 118 such as a dilution gas, a material gas, and a doping gas is introduced from the gas intake section 110. Examples of the dilution gas include a gas including a hydrogen gas. Examples of the material gas include a silane base gas, a methane gas, a germane gas, and the like. Examples of the doping gas include a doping gas of a p-type impurity such as a diborane gas, and a doping gas of an n-type impurity such as a phosphine gas.

Further, the gas exhaust section 116 and a pressure control valve 117 are connected in series to the film forming chamber 101, and the gas pressure in the film forming chamber 101 is kept approximately constant. It is desirable that the gas pressure is measured at a position away from the gas intake section 110 and a gas exhaust outlet 119 in the film forming chamber, because measurement of the gas pressure at a position close to the gas intake section 110 and the gas exhaust outlet 119 causes errors somewhat. By supplying electric power to the cathode electrode 102 under this condition, it is possible to generate plasma between the cathode electrode 102 and the anode electrode 103 to decompose the gas 118, and to form the semiconductor layer on the substrate 107.

The gas exhaust section 116 may be one capable of evacuating the film forming chamber 101 to reduce the gas pressure in the film forming chamber 101 to a high vacuum of approximately $1.0 \times 10^{-4}$ Pa, but it may be one having an ability for evacuating gases in the film forming chamber 101 to a pressure of approximately 0.1 Pa in view of simplification of an apparatus, cost reduction, and an increase in throughput. The volume of the film forming chamber 101 has been getting larger as the size of the substrate of the semiconductor device grows. When such a film forming chamber 101 is highly evacuated to a vacuum, a high-performance gas exhaust section 116 is required, and therefore it is not desirable from the viewpoint of simplification of an apparatus and cost reduction, and it is more desirable to use a simple gas exhaust section 116 for a low vacuum.

Examples of the simple gas exhaust section 116 for a low vacuum include a rotary pump, a mechanical booster pump, a sorption pump, and the like, and it is preferable to use these pumps alone or in combination of two or more kinds thereof.

The film forming chamber 101 of the plasma CVD apparatus used in this embodiment can be sized in approximately 1 $m^3$, for example. As a typical gas exhaust section 116, a mechanical booster pump and a rotary pump connected in series can be used.

3. Method for Producing Photoelectric Conversion Device

Next, a method for producing the above-described photoelectric conversion device 1 will be described. The photoelectric conversion device 1 can be produced by forming the first electrode 3, the first photoelectric conversion layer 5, the second photoelectric conversion layer 7, the third photoelectric conversion layer 9, and the second electrode 11 in order from a light entrance side on the substrate 2.

In this embodiment, three photoelectric conversion layers of the first photoelectric conversion layer 5, the second photoelectric conversion layer 7, and the third photoelectric conversion layer 9 are formed in this order, but for example, three photoelectric conversion layers of the third photoelectric conversion layer 9, the second photoelectric conversion layer 7, and the first photoelectric conversion layer 5 may be formed in this order on the second electrode 11. Further, when a photoelectric conversion device of a substrate structure is formed, it is preferable to form three photoelectric conversion layers of the third photoelectric conversion layer 9, the second photoelectric conversion layer 7, and the first photoelectric conversion layer 5 in this order on a substrate. All the structures above are alike in terms of the fact that the first photoelectric conversion layer 5, the second photoelectric conversion layer 7, and the third photoelectric conversion layer 9 are arranged in this order from a light entrance side.

Hereinafter, the method for producing the photoelectric conversion device will be described taking, as an example, the case of forming the semiconductor layer by use of a plasma CVD apparatus of a single chamber type having one film forming chamber, as illustrated in FIG. 2, but the following description is basically also true for the case of forming the semiconductor layer by use of a plasma CVD apparatus of a multi-chamber type. However, with the plasma CVD apparatus of a multi-chamber type, a gas replacement step to be described later can be omitted, because the p-type, the i-type, and the n-type semiconductor layers can be formed in different film forming chambers.

In the production method of this embodiment, the first photoelectric conversion layer 5, the second photoelectric conversion layer 7, and the third photoelectric conversion layer 9 are formed in the same film forming chamber. To form the photoelectric conversion layers in the same film forming chamber means that the first, second, and third photoelectric conversion layers 5, 7, 9 are formed by use of the same electrode or different electrodes in the same film forming chamber, and it is desirable that the first, second, and third photoelectric conversion layers 5, 7, 9 are formed by use of the same electrode in the same film forming chamber. Further, it is desirable from the viewpoint of improving production efficiency that the first, second, and third photoelectric conversion layers 5, 7, 9 are successively formed without being released to the air on the way. Furthermore, it is desirable from the viewpoint of improving production efficiency that substrate temperatures during the formation of the first, second, and third photoelectric conversion layers 5, 7, 9 are the same.

Hereinafter, the method for producing the photoelectric conversion device 1 will be described in detail. The method to be described below is exemplification, and the photoelectric conversion device 1 may be produced by a method other than the method to be described below.

3-1. Step of Forming First Electrode

First, the first electrode 3 is formed on the substrate 2.

As the substrate 2, a glass substrate and a substrate of a resin such as polyimide and the like which have heat resistance and a light transmitting property in a plasma CVD forming process can be used.

As the first electrode 3, a transparent conductive film of $SnO_2$, ITO, ZnO, or the like can be used. They may be formed by a method such as a CVD method, a sputtering method, and a vapor deposition method.

3-2. Step of Forming First Photoelectric Conversion Layer

Next, the first photoelectric conversion layer 5 is formed on the obtained substrate. As described above, since the first photoelectric conversion layer 5 has the p-type semiconductor layer 5a, the buffer layer 5b, the i-type amorphous layer 5c, and the n-type semiconductor layer 5d, the respective semiconductor layers are formed in order.

A gas replacement step of replacing the inside of the film forming chamber 101 with a replacement gas is performed to reduce the concentration of impurities in the film forming chamber 101 before the formation of the p-type semiconductor layer 5a (that is, before the formation of the first photoelectric conversion layer 5) and before the formation of the i-type amorphous layer 5c. Since the impurities introduced in the preceding step or the impurities immixed from the outside when a substrate is carried into the film forming chamber 101 remain in the film forming chamber 101, quality of the semiconductor layer is deteriorated if the semiconductor layer takes in the impurities. Therefore, the concentration of the impurities in the film forming chamber 101 is reduced in advance. The gas replacement step is also performed before the formation of the p-type semiconductor layer 7a (that is, before the formation of the second photoelectric conversion layer 7), before the formation of the i-type amorphous layer 7c, before the formation of the p-type semiconductor layer 9a (that is, before the formation of the third photoelectric conversion layer 9), and before the formation of the i-type microcrystalline layer 9b. Here, each gas replacement step may be performed under the same condition, or under different conditions.

In addition, when the plasma CVD apparatus of a multi-chamber type is used, the concentration of the impurities in the film forming chamber can be reduced by changing the film forming chamber in place of performing the gas replacement step. In general, the p-type semiconductor layer 5a and the buffer layer 5b are formed in a first film forming chamber, the i-type amorphous layer 5c is formed in a second film forming chamber, and the n-type semiconductor layer 5d is formed in a third film forming chamber. Further, the p-type semiconductor layer 7a, the buffer layer 7b, and the p-type semiconductor layer 9a are formed in the first film forming chamber, the i-type amorphous layer 7c and the i-type microcrystalline layer 9b are formed in the second film forming chamber, and the n-type semiconductor layer 7d and the n-type semiconductor layer 9c are formed in the third film forming chamber. The p-type amorphous layer and the buffer layer may be formed in different film forming chambers.

Hereinafter, a step of forming the first photoelectric conversion layer 5 will be described in detail.

3-2 (1) Gas Replacement Step

The substrate 2 on which the first electrode 3 is formed is installed in the film forming chamber 101, and thereafter the gas replacement step of replacing the inside of the film forming chamber 101 with a replacement gas is performed. This gas replacement step is performed to reduce the concentration of the impurities which are immixed from the outside of the film forming chamber 101 in carrying a substrate to be provided with a semiconductor layer into the film forming chamber 101. Further, when the photoelectric conversion device is produced repeatedly, the first to third photoelectric conversion layers are formed repeatedly, and therefore the n-type semiconductor layer 9c of the third photoelectric conversion layer 9, previously formed, is deposited on an inner wall, an electrode, and the like in the film forming chamber 101. Therefore, it will be a problem that impurities released from the n-type semiconductor layer 9c of the third photoelectric conversion layer 9, particularly impurities that determine a conductive type of the n-type semiconductor layer 9c of the third photoelectric conversion layer 9 are immixed in the p-type semiconductor layer 5a of the first photoelectric conversion layer 5. Accordingly, the gas replacement step is performed before the formation of the p-type semiconductor layer 5a to reduce the amount of n-type impurities to be immixed in the p-type semiconductor layer 5a.

Thereby, a semiconductor layer of good quality can be formed as the p-type semiconductor layer 5a of the first photoelectric conversion layer 5. Here, since the p-type semiconductor layer 5a generally includes p-type conductive impurities in a concentration of approximately $1 \times 10^{20}$ cm$^{-3}$, satisfactory photoelectric conversion characteristics are attained if the concentration of the immixed n-type conductive impurities is approximately $1\times10^{18}$ cm$^{-3}$ or less, which is 2 orders of magnitude lower than the concentration of the p-type conductive impurities.

The gas replacement step can be performed through an operation cycle in which, for example, a hydrogen gas is introduced into the film forming chamber 101 as a replacement gas (step of introducing a replacement gas), the introduction of the hydrogen gas is stopped when the internal pressure of the film forming chamber 101 reaches a predetermined pressure (for example, approximately 100 Pa to 1000 Pa), and the hydrogen gas is evacuated until the internal pressure of the film forming chamber 101 reaches a predetermined pressure (for example, approximately 1 Pa to 10 Pa) (evacuation step). This cycle may be repeated more than once.

The period of time required to perform the above-mentioned one cycle can be several seconds to several tens of seconds. Specifically, the step of introducing a replacement gas can be performed over 1 to 5 seconds, and the evacuation step can be performed over 30 to 60 seconds. Even when the steps are performed in such a short period of time, the concentration of the impurities in the film forming chamber can be reduced by repeating this cycle more than once. Therefore, the method for producing the photoelectric conversion device according to this embodiment is also practical when applied to mass production devices.

In this embodiment, it is preferable that an internal pressure of the film forming chamber 101 after introducing a replacement gas and an internal pressure after evacuating the replacement gas are set in advance. In the step of introducing a replacement gas, the evacuation from the film forming chamber 101 is stopped, and when the internal pressure of the film forming chamber 101 reaches above the internal pressure after introducing the replacement gas, the introduction of the replacement gas is stopped to terminate the step of introducing a replacement gas. In the evacuation step, the introduction of the replacement gas is stopped, and when the internal pressure of the film forming chamber 101 reaches below the internal pressure after evacuating the replacement gas, the evacuation is stopped to terminate the evacuation step.

By increasing the number of repetitions of the cycle, or by decreasing the ratio (M/m) of a pressure M after evacuating the replacement gas to a pressure m after introducing the replacement gas, the concentration of the impurities existing in the film forming chamber 101 can be more reduced.

Further, in this embodiment, the present invention is described taking, as an example, the case where a hydrogen gas is used as a replacement gas, but in another embodiment, any gas usable for formation of an i-type layer, such as a silane gas, may be used as a replacement gas. The gas usable for the formation of the i-type layer is also usable for the formation of any of the p-type, i-type, and n-type semiconductor layers. Accordingly, it is preferable to use a gas used for the formation of the i-type layer as a replacement gas, because in this case, no impurity from this gas is immixed in the semiconductor layer.

Further, in another embodiment, an inert gas or the like, which does not have an impact on film quality of the semiconductor layer may be used as a replacement gas. In particular, a gas having a larger atomic weight is apt to remain in the film forming chamber 101 after the evacuation of the inside of the film forming chamber 101 and is suitable for the replacement gas. Examples of the inert gas include an argon gas, a neon gas, a xenon gas, and the like.

Further, the replacement gas may be a mixture gas of any one or more of gases usable for the formation of the i-type layer and one or more inert gases.

3-2 (2) Step of Forming p-Type Semiconductor Layer

Next, the p-type semiconductor layer 5a is formed. Hereinafter, a step of forming the p-type semiconductor layer 5a will be described.

First, the inside of the film forming chamber 101 can be evacuated to a pressure of 0.001 Pa, and the substrate temperature can be set at a temperature of 200° C. or lower. Thereafter, the p-type semiconductor layer 5a is formed. A mixture gas is introduced into the film forming chamber 101 and the internal pressure of the film forming chamber 101 is kept approximately constant by the pressure control valve 117 provided in an exhaust system. The internal pressure of the film forming chamber 101 is adjusted to be in a range of, for example, 200 Pa to 3600 Pa. As the mixture gas to be introduced into the film forming chamber 101, for example, a gas including a silane gas, a hydrogen gas, and a diborane gas can be used. Further, the mixture gas can include a gas (for example, methane gas) containing carbon atoms in order to reduce the amount of light absorption. The flow rate of the hydrogen gas can be 5 times or more and 300 times or less larger than that of the silane gas, and it is preferably approximately 5 times to 30 times in the case of forming a p-type amorphous layer, and approximately 30 times to 300 times in the case of forming a p-type microcrystalline layer.

After the internal pressure of the film forming chamber 101 is stabilized, an alternating electric power of several kHz to 80 MHz is inputted to the cathode electrode 102 to generate plasma between the cathode electrode 102 and the anode electrode 103, thereby forming an amorphous or microcrystalline p-type semiconductor layer 5a. The power density per unit area of the cathode electrode 102 is preferably in a range of 0.01 W/cm$^2$ to 0.3 W/cm$^2$ in the case of forming a p-type amorphous layer, and it is preferably in a range of 0.02 W/cm$^2$ to 0.5 W/cm$^2$ in the case of forming a p-type microcrystalline layer.

Thus, the p-type semiconductor layer 5a having a desired thickness is formed, and then input of the alternating electric power is stopped and the inside of the film forming chamber 101 is evacuated to a vacuum.

The thickness of the p-type semiconductor layer 5a is preferably 2 nm or more, more preferably 5 nm or more in terms of providing an adequate internal electric field for the i-type amorphous layer 5c. Further, the thickness of the p-type semiconductor layer 5a is preferably 50 nm or less, more preferably 30 nm or less in terms of necessity for suppressing the amount of light absorption on a side of light entrance of an inactive layer.

3-2 (3) Step of Forming Buffer Layer

Next, an i-type amorphous layer is formed as the buffer layer 5b. First, the background pressure in the film forming chamber 101 is evacuated to a vacuum of approximately 0.001 Pa. The substrate temperature can be set at a temperature of 200° C. or lower. Next, a mixture gas is introduced into the film forming chamber 101 and the internal pressure of the film forming chamber 101 is kept approximately constant by the pressure control valve 117. The internal pressure of the film forming chamber 101 is adjusted to be in a range of, for example, 200 Pa to 3000 Pa. As the mixture gas to be introduced into the film forming chamber 101, for example, a gas including a silane gas and a hydrogen gas can be used. Further, the mixture gas can include a gas (for example, methane gas) containing carbon atoms in order to reduce the amount of light absorption. Desirably, the flow rate of a hydrogen gas is approximately several times to several tens of times larger than that of the silane gas.

After the internal pressure of the film forming chamber 101 is stabilized, an alternating electric power of several kHz to 80

MHz is inputted to the cathode electrode 102 to generate plasma between the cathode electrode 102 and the anode electrode 103, thereby forming an i-type amorphous layer as the buffer layer 5b. The power density per unit area of the cathode electrode 102 can be in a range of 0.01 W/cm$^2$ to 0.3 W/cm$^2$.

Thus, the i-type amorphous layer having a desired thickness is formed as the buffer layer 5b, and then input of the alternating electric power is stopped and the inside of the film forming chamber 101 is evacuated to a vacuum.

By forming the i-type amorphous layer as the buffer layer 5b, the concentration of boron atoms in atmosphere in the film forming chamber 101 is reduced to allow reduction of boron atoms to be immixed in the i-type amorphous layer 5c to be formed next.

The thickness of the i-type amorphous layer as the buffer layer 5b is desirably 2 nm or more in order to inhibit diffusion of boron atoms from the p-type semiconductor layer 5a to the i-type amorphous layer 5c. On the other hand, this thickness is desirably as small as possible in order to suppress the amount of light absorption to increase light reaching the i-type amorphous layer 5c. The thickness of the buffer layer 5b is generally adjusted to 50 nm or less.

3-2 (4) Gas Replacement Step

Next, a gas replacement step is performed by the same method as in "3-2 (1) Gas replacement step".

The p-type semiconductor layer 5a, formed in the preceding step, is deposited on an inner wall and an electrode in the film forming chamber 101. Therefore, it will be a problem that impurities released from the p-type semiconductor layer 5a, particularly impurities that determine a conductive type of the p-type semiconductor layer 5a are immixed in the i-type amorphous layer 5c, but by performing the gas replacement step before the formation of the i-type amorphous layer 5c, the amount of the above-mentioned impurities to be immixed in the i-type amorphous layer 5c can be reduced. Thereby, a semiconductor layer of good quality can be formed as the i-type amorphous layer 5c.

3-2 (5) Step of Forming i-Type Amorphous Layer

Next, the i-type amorphous layer 5c is formed. First, the background pressure in the film forming chamber 101 is evacuated to a vacuum of approximately 0.001 Pa. The substrate temperature can be set at a temperature of 200° C. or lower. Next, a mixture gas is introduced into the film forming chamber 101 and the internal pressure of the film forming chamber 101 is kept approximately constant by the pressure control valve 117. The internal pressure of the film forming chamber 101 is adjusted to be in a range of, for example, 200 Pa to 3000 Pa. As the mixture gas to be introduced into the film forming chamber 101, for example, a gas including a silane gas and a hydrogen gas can be used. The flow rate of the hydrogen gas is preferably approximately several times to several tens of times larger than that of the silane gas, more preferably 5 times or more and 30 times or less. In this case, the i-type amorphous layer 5c of good film quality can be formed.

After the internal pressure of the film forming chamber 101 is stabilized, an alternating electric power of several kHz to 80 MHz is inputted to the cathode electrode 102 to generate plasma between the cathode electrode 102 and the anode electrode 103, thereby forming the i-type amorphous layer 5c. The power density per unit area of the cathode electrode 102 can be in a range of 0.01 W/cm$^2$ to 0.3 W/cm$^2$.

Thus, the i-type amorphous layer 5c having a desired thickness is formed, and then input of the alternating electric power is stopped and the inside of the film forming chamber 101 is evacuated to a vacuum.

The thickness of the i-type amorphous layer 5c is preferably set at 0.05 μm to 0.25 μm in consideration of the amount of light absorption and deterioration of photoelectric conversion characteristics due to light degradation.

3-2 (6) Step of Forming n-Type Semiconductor Layer

Next, the n-type semiconductor layer 5d is formed. First, the background pressure in the film forming chamber 101 is evacuated to a vacuum of approximately 0.001 Pa. The substrate temperature can be set at a temperature of 200° C. or lower, for example 150° C. Next, a mixture gas is introduced into the film forming chamber 101 and the internal pressure of the film forming chamber 101 is kept approximately constant by the pressure control valve 117. The internal pressure of the film forming chamber 101 is adjusted to be in a range of, for example, 200 Pa to 3600 Pa. As the mixture gas to be introduced into the film forming chamber 101, a gas including a silane gas, a hydrogen gas, and a phosphine gas can be used. The flow rate of the hydrogen gas can be 5 times or more and 300 times or less larger than that of the silane gas, and it is preferably approximately 5 times to 30 times in the case of forming an n-type amorphous layer, and approximately 30 times to 300 times in the case of forming an n-type microcrystalline layer.

After the internal pressure of the film forming chamber 101 is stabilized, an alternating electric power of several kHz to 80 MHz is inputted to the cathode electrode 102 to generate plasma between the cathode electrode 102 and the anode electrode 103, thereby forming an amorphous or microcrystalline n-type semiconductor layer 5d. The power density per unit area of the cathode electrode 102 is preferably in a range of 0.01 W/cm$^2$ to 0.3 W/cm$^2$ in the case of forming an n-type amorphous layer, and it is preferably in a range of 0.02 W/cm$^2$ to 0.5 W/cm$^2$ in the case of forming an n-type microcrystalline layer.

The thickness of the n-type semiconductor layer 5d is preferably 2 nm or more in order to provide an adequate internal electric field for the i-type amorphous layer 5c. On the other hand, the thickness of the n-type semiconductor layer 5d is preferably as small as possible in order to suppress the amount of light absorption in the n-type semiconductor layer 5d as an inactive layer, and it is generally adjusted to 50 nm or less.

Thus, the first photoelectric conversion layer 5 including the i-type amorphous layer 5c can be formed.

3-3. Step of Forming Second Photoelectric Conversion Layer

Next, the second photoelectric conversion layer 7 is formed on the obtained substrate. As described above, the second photoelectric conversion layer 7 has the p-type semiconductor layer 7a, the buffer layer 7b, the i-type amorphous layer 7c, and the n-type semiconductor layer 7d, and the respective semiconductor layers are therefore formed in order.

Hereinafter, a step of forming the second photoelectric conversion layer 7 will be described in detail.

3-3 (1) Gas Replacement Step

Next, a gas replacement step is performed by the same method as in "3-2 (1) Gas replacement step". By performing this gas replacement step, it is possible to reduce the amount of impurities released from the n-type semiconductor layer deposited on an inner wall and an electrode in the film forming chamber 101 during the formation of the n-type semiconductor layer 5d, particularly impurities that determine a conductive type of the n-type semiconductor layer 5d to be immixed in the p-type semiconductor layer 7a. Thereby, a semiconductor layer of good quality can be formed as the p-type semiconductor layer 7a. Here, since the p-type semiconductor layer 7a includes p-type conductive impurities in a concentration of approximately $1 \times 10^{20}$ cm$^{-3}$, satisfactory photoelectric conversion characteristics are attained if the concentration of immixed n-type conductive impurities is approximately $1\times10^{18}$ cm$^{-3}$ or less, which is 2 orders of magnitude lower than the concentration of the p-type conductive impurities.

3-3 (2) Step of Forming p-Type Semiconductor Layer

Next, the p-type semiconductor layer 7a is formed. The p-type semiconductor layer 7a can be formed in the same manner as in the formation of the p-type semiconductor layer 5a of the first photoelectric conversion layer 5.

3-3 (3) Step of Forming Buffer Layer

Next, the buffer layer 7b is formed in the same manner as in the formation of the buffer layer 5b of the first photoelectric conversion layer 5.

3-3 (4) Gas Replacement Step

Next, a gas replacement step is performed by the same method as in "3-2 (1) Gas replacement step". In this gas replacement step, an effect identical or similar to that in the gas replacement step performed before the formation of the i-type amorphous layer 5c of the first photoelectric conversion layer 5 can be attained.

3-3 (5) Step of Forming i-Type Amorphous Layer

Next, the i-type amorphous layer 7c is formed. The thickness of the i-type amorphous layer 7c is preferably set at 0.1 μm to 0.7 μm in consideration of the amount of light absorption and deterioration of the photoelectric conversion characteristics due to light degradation.

Further, it is desirable that the bandgap of the i-type amorphous layer 7c of the second photoelectric conversion layer 7 is smaller than the bandgap of the i-type amorphous layer 5c of the first photoelectric conversion layer 5. This is because, by forming such a bandgap, light of wavelength band that the first photoelectric conversion layer 5 cannot absorb can be absorbed in the second photoelectric conversion layer 7, and incident light can be utilized effectively.

In order to lessen the bandgap of the i-type amorphous layer 7c, the substrate temperature during the film formation can be set at a higher temperature. By increasing the substrate temperature, the concentration of hydrogen atoms contained in the film can be reduced and an i-type amorphous layer 7c having a small bandgap can be formed. That is, it is only necessary to adopt a substrate temperature for the formation of the i-type amorphous layer 7c of the second photoelectric conversion layer 7 higher than the substrate temperature for the formation of the i-type amorphous layer 5c of the first photoelectric conversion layer 5. Thereby, it is possible to make the concentration of hydrogen atoms in the i-type amorphous layer 5c of the first photoelectric conversion layer 5 higher than the concentration of hydrogen atoms in the i-type amorphous layer 7c of the second photoelectric conversion layer 7 and to produce a stacked photoelectric conversion device in which the bandgap of the i-type amorphous layer 5c of the first photoelectric conversion layer 5 is wider than the bandgap of the i-type amorphous layer 7c of the second photoelectric conversion layer 7.

Further, by decreasing the flow rate ratio of a hydrogen gas to a silane gas of a mixture gas to be introduced into the film forming chamber 101 in the formation of the i-type amorphous layer 7c, the concentration of hydrogen atoms contained in the i-type amorphous layer 7c can be reduced and an i-type amorphous layer 7c having a small bandgap can be formed. That is, it is only necessary to adopt a flow rate ratio of the hydrogen gas to the silane gas of the mixture gas for the formation of the i-type amorphous layer 7c of the second photoelectric conversion layer 7 smaller than that for the formation of the i-type amorphous layer 5c of the first photoelectric conversion layer 5. Thereby, it is possible to make the concentration of hydrogen atoms in the i-type amorphous layer 5c of the first photoelectric conversion layer 5 higher than the concentration of hydrogen atoms in the i-type amorphous layer 7c of the second photoelectric conversion layer 7 and to produce a stacked photoelectric conversion device in which the bandgap of the i-type amorphous layer 5c of the first photoelectric conversion layer 5 is wider than the bandgap of the i-type amorphous layer 7c of the second photoelectric conversion layer 7.

Furthermore, it is also possible to adjust the bandgap of the i-type amorphous layer by selecting either forming the i-type amorphous layer by continuous discharge plasma or forming the i-type amorphous layer by pulse discharge plasma. When the i-type amorphous layer is formed by continuous discharge plasma, the concentration of hydrogen atoms contained in the i-type amorphous layer to be formed can be made higher than that in the case of forming the i-type amorphous layer by pulse discharge plasma.

Accordingly, it is possible to produce a stacked photoelectric conversion device in which the bandgap of the i-type amorphous layer 5c of the first photoelectric conversion layer 5 is wider than the bandgap of the i-type amorphous layer 7c of the second photoelectric conversion layer 7 by switching supply electric power for generating plasma so that the i-type amorphous layer 5c of the first photoelectric conversion layer 5 can be formed by continuous discharge plasma and the i-type amorphous layer 7c of the second photoelectric conversion layer 7 can be formed by pulse discharge plasma.

The setting of the substrate temperatures for the formation of the i-type amorphous layer 5c of the first photoelectric conversion layer 5 and the i-type amorphous layer 7c of the second photoelectric conversion layer 7, the setting of the flow rate ratio of the hydrogen gas to the silane gas, and the setting of the switching between the continuous discharge and the pulse discharge may be done separately, or the respective settings may be used in combination. In particular, when the substrate temperatures for the formation of the i-type amorphous layer 5c of the first photoelectric conversion layer 5 and the i-type amorphous layer 7c of the second photoelectric conversion layer 7 are the same, concurrent use of the setting of the flow rate ratio of the hydrogen gas to the silane gas and the switching between the continuous discharge and the pulse discharge is desirable, because it allows the concentration of hydrogen atoms contained in the i-type amorphous layer to be changed by a large amount.

3-3 (6) Step of Forming n-Type Semiconductor Layer

Next, the n-type semiconductor layer 7d is formed. The n-type semiconductor layer 7d can be formed in the same manner as in the formation of the n-type semiconductor layer 5d of the first photoelectric conversion layer 5.

3-4. Step of Forming Third Photoelectric Conversion Layer

Next, the third photoelectric conversion layer 9 is formed on the obtained substrate. As described above, the third photoelectric conversion layer 9 has the p-type semiconductor layer 9a, the i-type microcrystalline layer 9b, and the n-type semiconductor layer 9e, and the respective semiconductor layers are therefore formed in order.

Hereinafter, a step of forming the third photoelectric conversion layer 9 will be described in detail.

3-4 (1) Gas Replacement Step

First, a gas replacement step is performed by the same method as in "3-2 (1) Gas replacement step". This gas replacement step has an effect identical or similar to that in the gas replacement step performed before the formation of the second photoelectric conversion layer 7.

3-4 (2) Step of Forming p-Type Semiconductor Layer

Next, the p-type semiconductor layer 9a is formed. The p-type semiconductor layer 9a can be formed in the same manner as in the formation of the p-type semiconductor layer 5a of the first photoelectric conversion layer 5.

3-4 (3) Gas Replacement Step

Next, a gas replacement step is performed by the same method as in "3-2 (1) Gas replacement step". This gas replacement step has an effect identical or similar to that in the gas replacement step performed before the formation of the i-type amorphous layer 5c of the first photoelectric conversion layer 5 and the i-type amorphous layer 7c of the second photoelectric conversion layer 7.

3-4 (4) Step of Forming i-Type Microcrystalline Layer

Next, the i-type microcrystalline layer 9b is formed. The i-type microcrystalline layer 9b can be formed, for example, under the following formation conditions. The substrate temperature is desirably set at a temperature of 200° C. or lower. The internal pressure of the film forming chamber 101 during the formation of the layer is desirably in a range of 240 Pa to 3600 Pa. Further, the power density per unit area of the cathode electrode 102 is desirably set to be in a range of 0.02 W/cm$^2$ to 0.5 W/cm$^2$.

As a mixture gas to be introduced into the film forming chamber 101, for example, a gas including a silane gas and a hydrogen gas may be used. The flow rate of the hydrogen gas is desirably approximately 30 times to several hundreds of times larger than that of the silane gas, more desirably approximately 30 times to 300 times larger than that of the silane gas.

The thickness of the i-type microcrystalline layer 9b is preferably 0.5 μm or more, more preferably 1 μm or more in order to secure an adequate amount of light absorption. On the other hand, the thickness of the i-type microcrystalline layer 9b is preferably 20 μm or less, more preferably 15 μm or less in order to secure good productivity.

Thus, an i-type microcrystalline layer 9b having a good crystallinity, in which the intensity ratio $I_{520}/I_{480}$ of a peak at 520 nm$^{-1}$ to a peak at 480 nm$^{-1}$, measured by Raman spectroscopy, is in a range of 3 to 10 can be formed.

3-4 (5) Step of Forming n-Type Semiconductor Layer

Next, the n-type semiconductor layer 9c is formed. The n-type semiconductor layer 9c can be formed in the same manner as in the formation of the n-type semiconductor layer 5d of the first photoelectric conversion layer 5.

3-5. Step of Forming Second Electrode

Next, the second electrode 11 is formed on the third photoelectric conversion layer 9. Since the second electrode 11 has a transparent conductive film 11a, and the metal film 11b, these films are formed in order.

The transparent conductive film 11a is made of SnO$_2$, ITO, ZnO, or the like. The metal film 11b is made of a metal such as silver, aluminum, or the like. The transparent conductive film 11a and the metal film 11b can be formed by a method such as a CVD method, a sputtering method, and a vapor deposition method. The transparent conductive film 11a can be omitted.

Thus, the steps of producing the photoelectric conversion device of this embodiment are completed.

4. Effect Proving Experiment

A photoelectric conversion device in which the first short-circuit photocurrent is larger than the second short-circuit photocurrent or the third short-circuit photocurrent under the standard condition, and a photoelectric conversion device in which the short-circuit photocurrent of the first photoelectric conversion layer is smaller than the second short-circuit photocurrent under the standard condition were produced and examined for the spectrum dependence to prove that decrease of the output in the morning and evening can be inhibited in the photoelectric conversion device of the former case.

4-1. Method for Producing Photoelectric Conversion Device

A photoelectric conversion device 1 having a configuration illustrated in FIG. 1 was produced by use of a plasma CVD apparatus of a multi-chamber system having a plurality of film forming chambers 101 as illustrated in FIG. 2. The film forming chambers of the plasma CVD apparatus used here have an internal size of 1 m×1 m×50 cm. The p-type semiconductor layers 5a, 7a and the buffer layers 5b, 7b; the i-type semiconductor layers 5c, 7c, 9c; and the n-type semiconductor layers 5d, 7d, 9c were separately formed in different film forming chambers 101.

Each element was formed of a material shown in Table 1. Eight types of photoelectric conversion devices that are different in the thickness of the i-type amorphous layer 5c (hereinafter, referred to as Samples 1 to 8) were produced. The thickness of the i-type amorphous layer 5c was increased in order of Samples 1 to 8. That is, the thickness of the i-type amorphous layer 5c was the thinnest in Sample 1 and the thickest in Sample 8. In Samples 1 to 8, the thickness of the i-type amorphous layer 7c and the thickness of the i-type microcrystalline layer 9b were adjusted so that the second short-circuit photocurrent and the third short-circuit photocurrent were almost the same under the standard condition.

TABLE 1

| Photoelectric conversion device 1 | | |
|---|---|---|
| Element | | Material |
| Substrate 2 | | Glass |
| First electrode 3 | | SnO$_2$ (projection-and-recess shape on surface) |
| First photoelectric conversion layer 5 | P-type semiconductor layer 5a (amorphous layer) | Amorphous silicon carbide |
| | Buffer layer 5b | Amorphous silicon carbide |
| | I-type amorphous layer 5c | Amorphous silicon |
| | N-type semiconductor layer 5d (amorphous layer) | Amorphous silicon |
| Second photoelectric conversion layer 7 | P-type semiconductor layer 7a (amorphous layer) | Amorphous silicon carbide |
| | Buffer layer 7b | Amorphous silicon carbide |
| | I-type amorphous layer 7c | Amorphous silicon |
| | N-type semiconductor layer 7d (amorphous layer) | Amorphous silicon |
| Third photoelectric conversion layer 9 | P-type semiconductor layer 9a (microcrystalline layer) | Microcrystalline silicon |
| | I-type microcrystalline layer 9b | Microcrystalline silicon |
| | N-type semiconductor layer 9c (microcrystalline layer) | Microcrystalline silicon |
| Second electrode 11 | Transparent conductive film 11a | ZnO |
| | Metal film 11b | Ag |

Hereinafter, steps of producing Samples 1 to 8 will be described in detail. In the following steps, all semiconductor layers were formed by continuous discharge plasma.)

4-1-1. Step of Forming First Photoelectric Conversion Layer 4-1-1 (1) Step of Forming p-Type Semiconductor Layer First, a p-type amorphous silicon carbide layer was formed as the p-type semiconductor layer 5a on the substrate 2 having a thickness of 4 mm on which the first electrode 3 having a thickness of 1 μm was formed. The p-type semiconductor layer 5a was formed under conditions such that the temperature of the substrate 2 was 190° C.; the internal pressure of the film forming chamber 101 of plasma CVD was 1000 Pa; the power density per unit area of the cathode electrode was 0.05 W/cm$^2$; and the mixture gas to be introduced into the film forming chamber 101 was composed of 150 sccm of an SiH$_4$ gas, 100 sccm of a B$_2$H$_6$ gas (diluted with hydrogen so as to have a concentration of 0.1%), 150 sccm of a CH$_4$ gas, and an H$_2$ gas having a flow rate ratio to the SiH$_4$ gas of 50, and the film thickness was adjusted to 15 nm.

4-1-1 (2) Step of Forming Buffer Layer

Next, an i-type amorphous silicon carbide layer was formed as the buffer layer 5b on the p-type semiconductor layer 5a. Formation of the buffer layer 5b was started under conditions such that the temperature of the substrate 2 was 200° C.; the internal pressure of the film forming chamber 101 of plasma CVD was 500 Pa; the power density per unit area of the cathode electrode was 0.05 W/cm$^2$; and the mixture gas to be introduced into the film forming chamber 101 was composed of 150 sccm of an SiH$_4$ gas, 150 sccm of a CH$_4$ gas, and an H$_2$ gas having a flow rate ratio to the SiH$_4$ gas of 10, and the buffer layer Sb was formed while controlling the gas flow rate in such a way that the CH$_4$ gas flow rate decreases gradually from 150 sccm to 0 sccm to adjust its film thickness to 5 nm. The film thickness was adjusted to 5 nm. Here, the CH$_4$ gas flow rate may be controlled so as to decrease gradually, or so as to decrease stepwise. It is desirable to control the CH$_4$ gas flow rate so as to decrease gradually or stepwise, because by such a control, discontinuity of a band profile at an interface between the p-type semiconductor layer 5a and the i-type amorphous layer 5c can be mitigated.

4-1-1 (3) Step of Forming i-Type Amorphous Layer

Next, an i-type amorphous silicon layer was formed as the i-type amorphous layer 5c on the buffer layer 5b. The i-type amorphous layer 5c was formed under conditions such that the temperature of the substrate 2 was 180° C.; the internal pressure of the film forming chamber 101 of plasma CVD was 500 Pa; the power density per unit area of the cathode electrode was 0.07 W/cm$^2$; and the mixture gas to be introduced into the film forming chamber 101 was composed of 300 seem of an SiH$_4$ gas; and an H$_2$ gas having a flow rate ratio to the SiH$_4$ gas of 20, and its film thickness was varied from sample to sample.

4-1-1 (4) Step of Forming n-Type Semiconductor Layer

Next, an amorphous silicon layer was formed as the n-type semiconductor layer (here, amorphous layer) 5d on the i-type amorphous layer 5c. The n-type semiconductor layer 5d was formed under conditions such that the temperature of the substrate 2 was 190° C.; the internal pressure of the film forming chamber 101 of plasma CVD was 500 Pa; the power density per unit area of the cathode electrode was 0.05 W/cm$^2$; and the mixture gas to be introduced into the film forming chamber 101 was composed of 150 sccm of an SiH$_4$ gas, 30 sccm of a PH$_3$ gas (diluted with a hydrogen gas so as to have a concentration of 1%), and an H$_2$ gas having a flow rate ratio to an SiH$_4$ gas of 5, and its film thickness was adjusted to 20 nm.

4-1-2. Step of Forming Second Photoelectric Conversion Layer 4-1-2 (1) Step of Forming p-Type Semiconductor Layer Next, a p-type amorphous silicon carbide layer was formed as the p-type semiconductor layer (here, amorphous layer) 7a of the second photoelectric conversion layer 7 on the n-type semiconductor layer 5d of the first photoelectric conversion layer 5. The formation condition was the same as that for the p-type semiconductor layer 5a of the first photoelectric conversion layer 5, but the film thickness was adjusted to 20 nm.

4-1-2 (2) Step of Forming Buffer Layer

Next, an i-type amorphous silicon carbide layer was formed as the buffer layer 7b on the p-type semiconductor layer 7a. The formation condition was identical to that for the buffer layer 5b of the first photoelectric conversion layer 5.

4-1-2 (3) Step of Forming i-Type Amorphous Layer

Next, an i-type amorphous silicon layer was formed as the i-type amorphous layer 7c on the buffer layer 7b. The i-type amorphous layer 7c was formed under conditions such that the temperature of the substrate 2 was 200° C.; the internal pressure of the film forming chamber 101 of plasma CVD was 500 Pa; the power density per unit area of the cathode electrode was 0.07 W/cm$^2$; and the mixture gas to be introduced into the film forming chamber 101 was composed of 300 sccm of an SiH$_4$ gas, and an H$_2$ gas having a flow rate ratio to an SiH$_4$ gas of 10, and its film thickness was adjusted so that the second short-circuit photocurrent would be a desired value.

The substrate temperature (180° C.) during the formation of the i-type amorphous layer 5c of the first photoelectric conversion layer 5 was made lower than the substrate temperature (200° C.) during the formation of the i-type amorphous layer 7c of the second photoelectric conversion layer 7. Thereby, the concentration of hydrogen atoms contained in the i-type amorphous layer 5c of the first photoelectric conversion layer 5 was made higher than that in the i-type amorphous layer 7c of the second photoelectric conversion layer 7, and the bandgap of the i-type amorphous layer 5c of the first photoelectric conversion layer 5 was made wider than that of the i-type amorphous layer 7c of the second photoelectric conversion layer 7.

4-1-2 (4) Step of Forming n-Type Semiconductor Layer

Next, an amorphous silicon layer was formed as the n-type semiconductor layer (here, amorphous layer) 7d on the i-type amorphous layer 7c. The formation condition was identical to that for the n-type semiconductor layer 5d of the first photoelectric conversion layer 5.

4-1-3. Step of Forming Third Photoelectric Conversion Layer 4-1-3 (1) Step of Forming p-Type Semiconductor Layer Next, a p-type microcrystalline silicon layer was formed as the p-type semiconductor layer (here, microcrystalline layer) 9a of the third photoelectric conversion layer 9 on the n-type semiconductor layer 7d of the second photoelectric conversion layer 7. The p-type semiconductor layer 9a was formed under conditions such that the temperature of the substrate 2 was 200° C.; the internal pressure of the film forming chamber 101 of plasma CVD was 1000 Pa; the power density per unit area of the cathode electrode was 0.15 W/cm$^2$; and the mixture gas to be introduced into the film forming chamber 101 was composed of 150 sccm of an SiH$_4$ gas, 30 sccm of a B$_2$H$_6$ gas (diluted with a hydrogen gas so as to have a concentration of 0.1%), and an H$_2$ gas having a flow rate ratio to the SiH$_4$ gas of 150, and its film thickness was adjusted to 20 nm.

4-1-3 (2) Step of Forming i-Type Microcrystalline Layer

Next, an i-type microcrystalline silicon layer was formed as the i-type microcrystalline layer 9b on the p-type semiconductor layer 9a. The i-type microcrystalline 9b was formed under conditions such as the temperature of the substrate 2 was 200° C.; the internal pressure of the film forming chamber 101 of plasma CVD was 2000 Pa; the power density per unit area of the cathode electrode was 0.15 W/cm$^2$; and the mixture gas to be introduced into the film forming chamber 101 was composed of 250 sccm of an SiH$_4$ gas, and an H$_2$ gas having a flow rate ratio to the SiH$_4$ gas of 100, and its film thickness was adjusted so that the third short-circuit photocurrent would be a desired value.

4-1-3 (3) Step of Forming n-Type Semiconductor Layer

Next, an n-type microcrystalline silicon layer was formed as the n-type semiconductor layer (here, microcrystalline layer) 9c on the i-type microcrystalline layer 9b. The n-type semiconductor layer 9c was formed under conditions such that the temperature of the substrate 2 was 200° C.; the internal pressure of the film forming chamber 101 of plasma CVD was 2000 Pa; the power density per unit area of the cathode electrode was 0.15 W/cm$^2$; and the mixture gas to be introduced into the film forming chamber 101 was composed of 150 seem of an SiH$_4$ gas, 30 sccm of a PH$_3$ gas (diluted with a hydrogen gas so as to have a concentration of 1%), and an H$_2$ gas having a flow rate ratio to the SiH$_4$ gas of 150, and its film thickness was adjusted to 20 nm.

4-1-4. Step of Forming Second Electrode

Next, the second electrode 11 including the transparent conductive film 11a having a thickness of 0.05 μm and the metal film 11b having a thickness of 0.1 μm was formed by a sputtering method to produce the photoelectric conversion device 1.

4-2. Measurement of Each Photoelectric Conversion Layer for Short-Circuit Photocurrent Next, Samples 1 to 8 produced as described above were measured for the short-circuit photocurrent under the standard condition. Table 2 shows the result. The third short-circuit photocurrent was almost the same as the second short-circuit photocurrent.

TABLE 2

|  | First short-circuit photocurrent | Second short-circuit photocurrent | First short-circuit photocurrent/Second short-circuit photocurrent |
|---|---|---|---|
| Sample 1 | 6.29 | 8.44 | 0.75 |
| Sample 2 | 6.62 | 8.13 | 0.81 |
| Sample 3 | 6.91 | 7.86 | 0.88 |
| Sample 4 | 7.18 | 7.59 | 0.95 |
| Sample 5 | 7.44 | 7.36 | 1.01 |
| Sample 6 | 7.67 | 7.14 | 1.07 |
| Sample 7 | 7.89 | 6.94 | 1.14 |
| Sample 8 | 8.1 | 6.75 | 1.20 |

Table 2 has revealed that the second short-circuit photocurrent is larger than the first short-circuit photocurrent in Samples 1 to 4, and the first short-circuit photocurrent is larger than the second short-circuit photocurrent in Samples 5 to 8. Samples 1 to 4 are comparative examples of the present invention, and Samples 5 to 8 are examples of the present embodiment.

It is considered that the first short-circuit photocurrent was larger than the second short-circuit photocurrent in Samples 5 to 8 for the reason that the i-type amorphous layer 5c of the first photoelectric conversion layer 5 in Samples 5 to 8 was relatively thick to allow more light to be absorbed in the first photoelectric conversion layer 5.

4-3. Measurement of Relative Value of Spectrum Dependence

Next, Samples 1 to 8 were measured for the output in the morning (9:00) and at noon (12:00). Samples 1 to 8 were disposed outdoors side by side to be measured for the output during clear and sunny time on May 8, 2007. The spectrum dependence was calculated from the result obtained. The spectrum dependence is defined as "output in the morning/output at noon".

Next, a tandem type (two-junction type) photoelectric conversion device was produced so that the first short-circuit photocurrent would be almost the same as the second short-circuit photocurrent under the standard condition, and the spectrum dependence of this photoelectric conversion device was calculated as well. Generally, tandem type photoelectric conversion devices are unlikely to be affected by spectral change compared to three-junction type photoelectric conversion devices.

Next, the relative value of spectrum dependence was calculated. The relative value of spectrum dependence is defined as "each spectrum dependence of Samples 1 to 8/spectrum dependence of tandem type photoelectric conversion device". The closer to 1 the relative value of spectrum dependence is, the less likely the device is to be affected by the spectral change.

Figure 3:
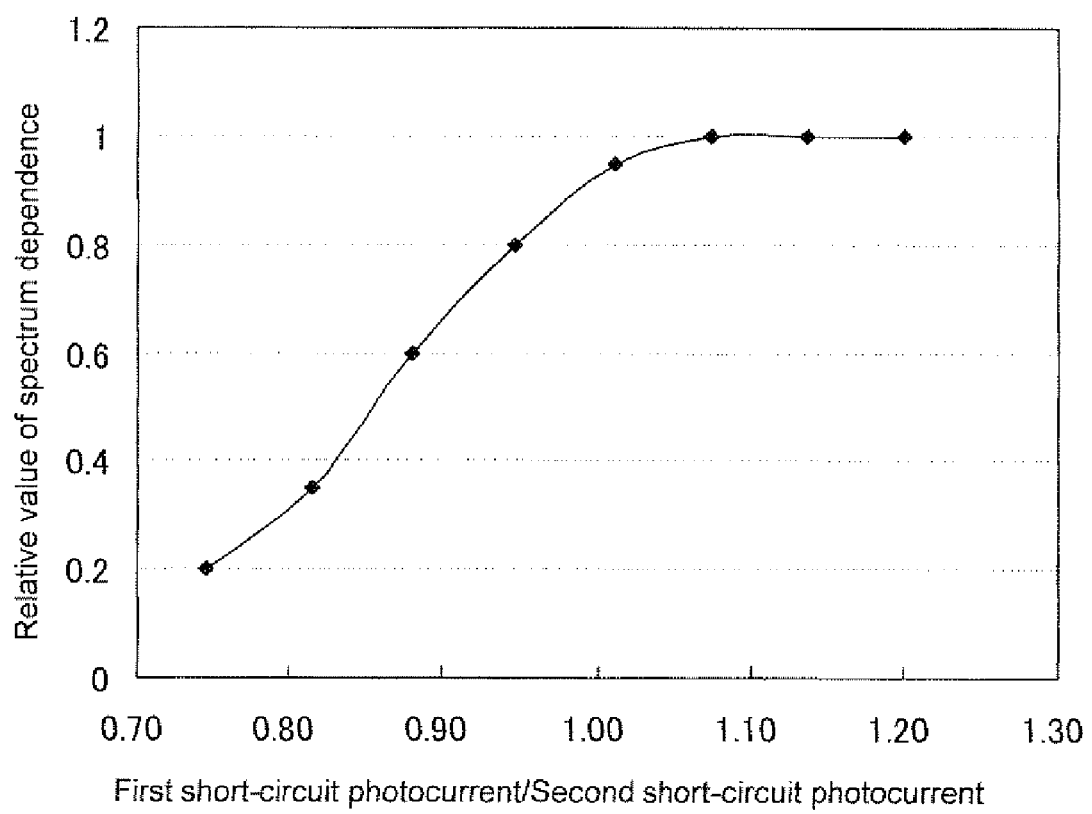
FIG. 3 is a graph showing the relationship between a first short-circuit photocurrent/a second short-circuit photocurrent and a relative value of spectrum dependence according to an effect proving experiment.

Table 3 shows the result. In addition, FIG. 3 shows Table 3 plotted. FIG. 3 is a graph showing the relationship between the first short-circuit photocurrent/the second short-circuit photocurrent and the relative value of spectrum dependence.

TABLE 3

|  | First short-circuit photocurrent/Second short-circuit photocurrent | Relative value of spectrum dependence |
|---|---|---|
| Sample 1 | 0.75 | 0.2 |
| Sample 2 | 0.81 | 0.35 |
| Sample 3 | 0.88 | 0.6 |
| Sample 4 | 0.95 | 0.8 |
| Sample 5 | 1.01 | 0.95 |
| Sample 6 | 1.07 | 1 |
| Sample 7 | 1.14 | 1 |
| Sample 8 | 1.20 | 1 |

Table 3 and FIG. 3 have revealed that the relative value of spectrum dependence gets closer to 1, that is, the impact of the spectral change is more inhibited, when the first short-circuit photocurrent/the second short-circuit photocurrent is 1.01 or more. This means that extreme decrease of the output in the morning and evening can be inhibited by setting the first short-circuit photocurrent to be larger than the second short-circuit photocurrent or the third short-circuit photocurrent under the standard condition.

The invention claimed is:

1. A stacked photoelectric conversion device comprising:
   a first photoelectric conversion layer, a second photoelectric conversion layer and a third photoelectric conversion layer stacked in this order from a light entrance side, each photoelectric conversion layer having a p-i-n junction and formed of a silicon based semiconductor, wherein
   a short-circuit photocurrent of the first photoelectric conversion layer is larger than a short-circuit photocurrent of the second photoelectric conversion layer or a short-circuit photocurrent of the third photoelectric conversion layer under a condition of light source: xenon lamp, irradiance: 100 mW/cm$^2$, AM: 1.5, and temperature: 25° C., wherein a ratio of the short-circuit photocurrent of the first photoelectric conversion layer to a smaller one of the short-circuit photocurrent of the second photoelectric conversion layer and the short-circuit photocurrent of the third photoelectric conversion layer is 1.01 to 1.30.

2. A stacked photoelectric conversion device comprising:

a first photoelectric conversion layer, a second photoelectric conversion layer and a third photoelectric conversion layer stacked in this order from a light entrance side, each photoelectric conversion layer having a p-i-n junction and formed of a silicon based semiconductor, wherein a short-circuit photocurrent of the first photoelectric conversion layer is larger than a short-circuit photocurrent of the second photoelectric conversion layer or a short-circuit photocurrent of the third photoelectric conversion layer under a condition of light source: xenon lamp, irradiance: 100 mW/cm$^2$, AM: 1.5, and temperature: 25° C., wherein i-type semiconductor layers of the first and second photoelectric conversion layers are amorphous layers, respectively, and an i-type semiconductor layer of the third photoelectric conversion layer is a microcrystalline layer.

* * * * *